(12) United States Patent
Cadag et al.

(10) Patent No.: US 11,916,090 B2
(45) Date of Patent: Feb. 27, 2024

(54) TAPELESS LEADFRAME PACKAGE WITH EXPOSED INTEGRATED CIRCUIT DIE

(71) Applicant: STMicroelectronics, Inc., Calamba (PH)

(72) Inventors: Aaron Cadag, Calamba (PH); Rohn Kenneth Serapio, Santa Rosa (PH); Ela Mia Cadag, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 135 days.

(21) Appl. No.: 17/342,765

(22) Filed: Jun. 9, 2021

(65) Prior Publication Data

US 2022/0005857 A1    Jan. 6, 2022

Related U.S. Application Data

(60) Provisional application No. 63/046,838, filed on Jul. 1, 2020.

(51) Int. Cl.
| | |
|---|---|
| H01L 31/0203 | (2014.01) |
| H01L 27/146 | (2006.01) |
| H01L 23/495 | (2006.01) |
| H01L 23/31 | (2006.01) |
| H01L 21/56 | (2006.01) |
| H01L 23/00 | (2006.01) |

(52) U.S. Cl.
CPC ........ *H01L 27/14618* (2013.01); *H01L 21/56* (2013.01); *H01L 23/3157* (2013.01); *H01L 23/49503* (2013.01); *H01L 24/16* (2013.01); *H01L 24/81* (2013.01); *H01L 2224/16258* (2013.01); *H01L 2224/8184* (2013.01)

(58) Field of Classification Search
CPC .............. H01L 27/14618; H01L 21/56; H01L 23/3157; H01L 23/49503; H01L 24/16; H01L 24/81; H01L 2224/16258; H01L 2224/8184
USPC ....................................................... 257/433
See application file for complete search history.

(56) References Cited

U.S. PATENT DOCUMENTS

| | | | |
|---|---|---|---|
| 6,602,803 B2 | 8/2003 | Yew et al. | |
| 6,943,434 B2 | 9/2005 | Tangpuz et al. | |
| 7,122,884 B2 | 10/2006 | Cabahug et al. | |
| 8,334,584 B2 * | 12/2012 | Camacho | ............. H01L 21/565 257/784 |

(Continued)

*Primary Examiner* — Caleb E Henry
*Assistant Examiner* — Dilinh P Nguyen
(74) *Attorney, Agent, or Firm* — Crowe & Dunlevy

(57) ABSTRACT

A first side of a tapeless leadframe package is etched to form a ring shaped protrusion and a lead protrusion extending from a base layer. An integrated circuit die is mounted to tapeless leadframe package in flip chip orientation with a front side facing the first side. An electrical and mechanical attachment is made between a bonding pad of the integrated circuit die and the lead protrusion. A mechanical attachment is made between the front side of the integrated circuit die and the ring shaped protrusion. The integrated circuit die and the protrusions from the tapeless leadframe package are encapsulated within an encapsulating block. The second side of the tapeless leadframe package is then etched to remove portions of the base layer and define a lead for a leadframe from the lead protrusion and further define a die support for the leadframe from the ring shaped protrusion.

7 Claims, 4 Drawing Sheets

(56) References Cited

U.S. PATENT DOCUMENTS

| | | |
|---|---|---|
| 9,490,146 B2 | 11/2016 | Talledo |
| 9,947,636 B2 | 4/2018 | Talledo |
| 10,147,673 B2 | 12/2018 | Talledo |
| 2002/0063314 A1 | 5/2002 | Read et al. |
| 2010/0258934 A1* | 10/2010 | Chang Chien ........ H01L 21/565 |
| | | 257/E23.116 |
| 2014/0008777 A1* | 1/2014 | Loh ........................ H01L 24/97 |
| | | 257/676 |
| 2016/0104663 A1* | 4/2016 | Wong ................ H01L 23/49503 |
| | | 257/670 |
| 2019/0096789 A1 | 3/2019 | Talledo |

* cited by examiner

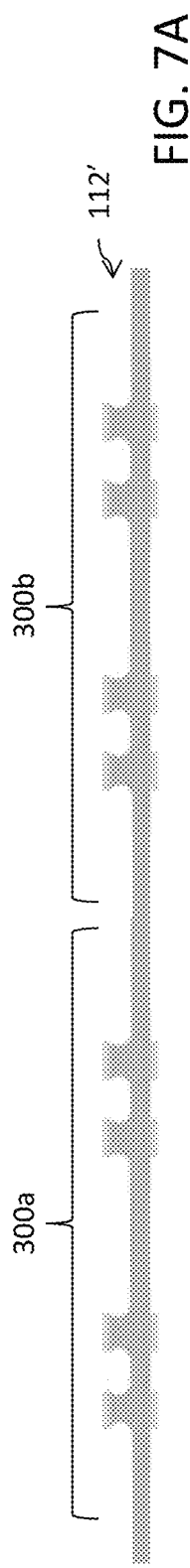
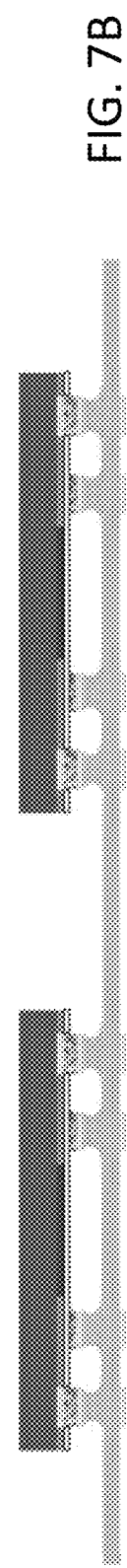
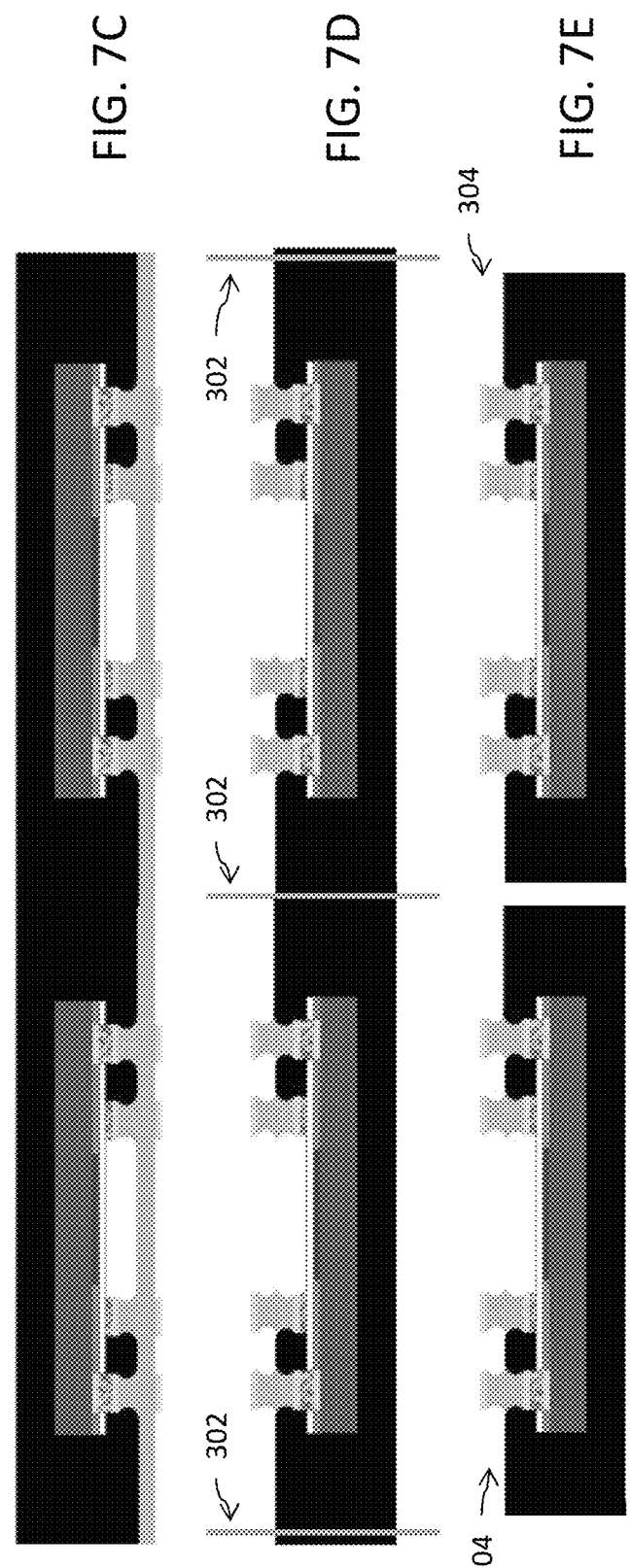

TAPELESS LEADFRAME PACKAGE WITH EXPOSED INTEGRATED CIRCUIT DIE

CROSS REFERENCE TO RELATED APPLICATION

This application claims priority from U.S. Provisional Application for Patent No. 63/046,838 filed Jul. 1, 2020, the disclosure of which is incorporated by reference.

TECHNICAL FIELD

The present invention generally relates to an integrated circuit package and, in particular, to an integrated circuit package utilizing a tapeless leadframe package supporting an exposed integrated circuit die.

BACKGROUND

Integrated circuit packages include a leadframe, an integrated circuit die mounted to a die pad of the leadframe and electrically connected to leads of the leadframe, and an encapsulating body that surrounds the integrated circuit die to provide a level of physical protection. There are a number of types of leadframes known in the art. Of particular interest is a leadframe which is used in the manufacture of a quad-flat no-lead (QFN) integrated circuit package. In this configuration, the leads of the leadframe do not extend beyond an outer perimeter of the encapsulating body. The die pad supporting the integrated circuit die may, or may not, have a surface (i.e., opposite the surface where the integrated circuit die is mounted) which is exposed from the encapsulating body.

There are a number of applications where it is important for the integrated circuit die to be exposed from the encapsulating body. For example, if the integrated circuit die includes an environment sensor such as an optical sensor, that sensor cannot be covered by the typically opaque material of the encapsulating body. It is a challenge, however, to provide for exposure of the integrated circuit die in a QFN integrated circuit package. FIG. 1A shows a cross-sectional view of a QFN integrated circuit package 10 including a leadframe 12 with a die pad 14 and leads 16, an optical integrated circuit die 18 that is adhesively mounted to an upper surface of the die pad 14, bonding wires 20 that extend from bonding pads on the front side of the integrated circuit die 18 to the leads 16. A protection (passivation) layer 28, for example made of a glass material, extends over the front side of the integrated circuit die 18, with the protection layer 28 covering an optical sensor 26 and including openings exposing the bonding pads on the front of the integrated circuit die 18 to support connection of the bonding wires. An encapsulating body 22 surrounds the integrated circuit die. There is an opening 24 extending into the encapsulating body 22 from a front side thereof to expose a location of the optical sensor 26. FIGS. 1B and 1C show isometric front side and back side, respectively, views of the QFN integrated circuit package 10.

There are a number of concerns with the package solution shown in FIGS. 1A-1C. The encapsulating body 22 is formed in a transfer molding process where the molding tool includes a spring loaded insert at the location where the opening 24 is formed. This spring loaded insert can produce a die crack. Additionally, mold flashing may form on the exposed area of the die and cover, at least partially, the optical sensor 26. The fabrication process further introduces a limitation on package thickness due to the presence of the bonding wires. The fabrication process also is expensive as it requires dedicated and costly mold tooling, the use of a mold release film and the electrical connection of the die to the leads through a bond wire process.

There is a need in the art to address the foregoing concerns.

SUMMARY

In an embodiment, a method comprises: etching a first side of a tapeless leadframe package to form a first protrusion and a second protrusion extending from a base layer; mounting an integrated circuit die in flip-chip orientation with a front side of the integrated circuit die facing the first side of the tapeless leadframe package, wherein mounting comprises electrically and mechanically attaching a bonding pad of the integrated circuit die to the first protrusion and mechanically attaching the front side of the integrated circuit die to the second protrusion; encapsulating the integrated circuit die and the first and second protrusions with an encapsulating material; and etching a second side of the tapeless leadframe package to remove portions of the base layer and define a lead for a leadframe from the first protrusion and further define a die support for the leadframe from the second protrusion.

In an embodiment, a tapeless leadframe package comprises: a base layer having a first side and a second side; a first protrusion extending from the base layer at the first side; a second protrusion extending from the base layer at the first side; a first plating layer at the first side, said first plating layer having a first pattern defining a size and shape of the first protrusion and the second protrusion; and a second plating layer at the second side, said second layer having a second pattern; wherein the first pattern of the first plating layer and the second pattern of the second plating layer are identical and aligned with each other.

In an embodiment, an integrated circuit package comprises: a tapeless leadframe including a ring shaped die support and a plurality of leads arranged in a regular pattern surrounding the ring shaped die support; wherein the ring shaped die support surrounds an open region delimited by an inner perimeter of the ring shaped die support; an integrated circuit die mounted to the tapeless leadframe in flip-chip orientation with a front side of the integrated circuit die facing a first side of the tapeless leadframe; an electrical and mechanical attachment between a bonding pad of the integrated circuit die and a corresponding one of the plurality of leads; a mechanical attachment between the front side of the integrated circuit die and the ring shaped die support; wherein the integrated circuit die includes an environment sensor and wherein the open region of the ring shaped die support is aligned with the environment sensor; and an encapsulating block that encapsulates the integrated circuit die, the plurality of leads and the ring shaped die support without covering the open region.

BRIEF DESCRIPTION OF THE DRAWINGS

For a better understanding of the embodiments, reference will now be made by way of example only to the accompanying figures in which:

FIGS. 7A-7E illustrate a sequence of process steps for the manufacture of a plurality of integrated circuit packages.

DETAILED DESCRIPTION

Figure 1A:
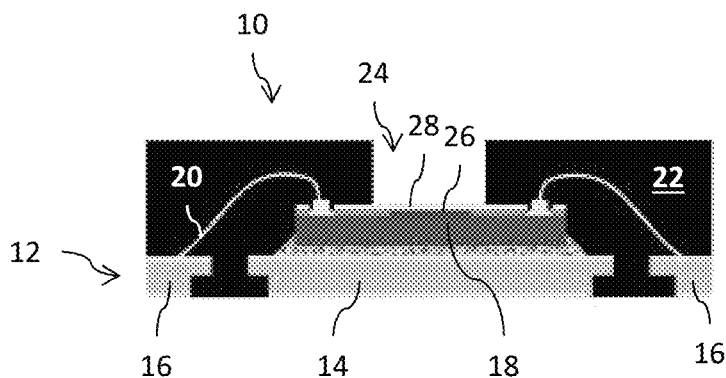
FIG. 1A is a cross-sectional view of a quad-flat no-lead (QFN) integrated circuit package known in the art.
Figure 1B:
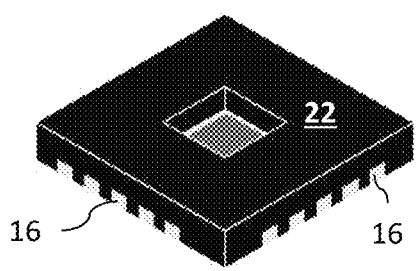
FIGS. 1B and 1C are isometric views of the QFN integrated circuit package of FIG. 1A.
Figure 1C:
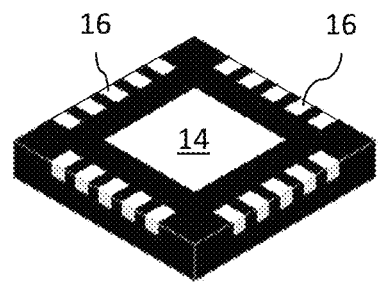
Figure 2A:
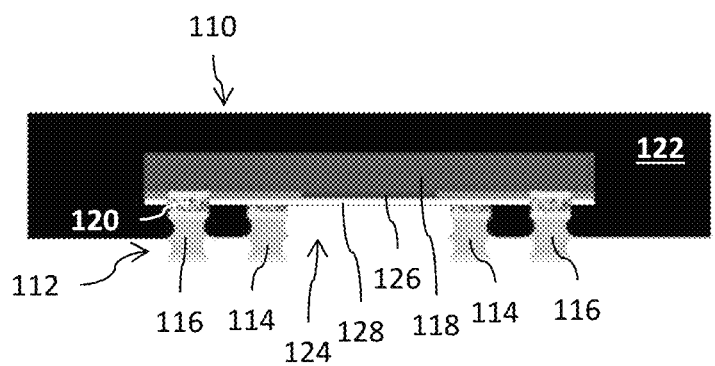
FIG. 2A is a cross-sectional view of a QFN integrated circuit package.
Figure 2B:
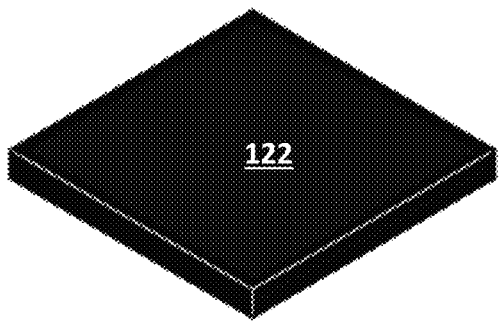
FIGS. 2B and 2C are isometric views of the QFN integrated circuit package of FIG. 2A.
Figure 2C:
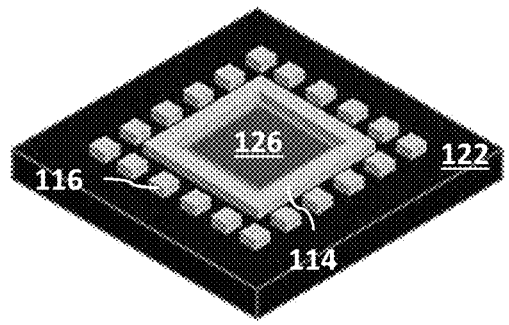

Reference is now made to FIG. 2A showing a cross-sectional view of a QFN integrated circuit package 100 including a leadframe 112 with a hollow die ring 114 and a plurality of leads 116, an integrated circuit die 118 mounted to an upper surface of the die ring 114 in a "flip chip" configuration with the bonding pads on the front of the integrated circuit die 118 facing the leadframe 112, and bonding posts 120 extending from bonding pads on the front of the integrated circuit die 118 to the plurality of leads 116. A protection (passivation) layer 128, for example made of a glass material, extends over the front side of the integrated circuit die 118, with the protection layer 128 including openings exposing the bonding pads on the front of the integrated circuit die 118 to support connection of the bonding posts 120. An encapsulating body 122 that surrounds the integrated circuit die. There is an opening 124 defined by the interior perimeter of the hollow die ring 114 (i.e., surrounded by the die ring) extending from a back side of the package to expose the location of an environment sensor such as, for example, an optical sensor 126 or a pressure sensor of the integrated circuit die 118. The die ring 114 provides a structure for supporting and mounting the integrated circuit die 118 to the leadframe 112. FIGS. 2B and 2C show isometric front side and back side, respectively, views of the QFN integrated circuit package 110.

FIGS. 3A to 6C show steps in a process for manufacturing the QFN integrated circuit package 100 as shown in FIGS. 2A-2C.

Figure 3A:
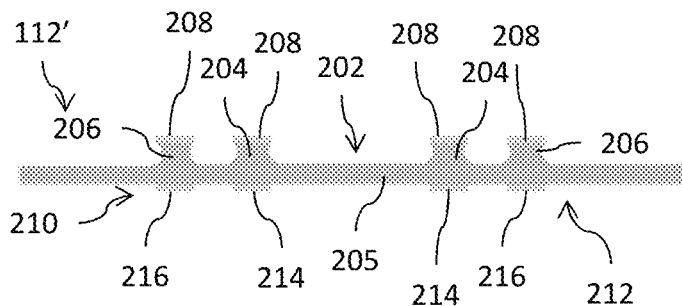
FIG. 3A is a cross-sectional view of a bare tapeless leadframe package.
Figure 3B:
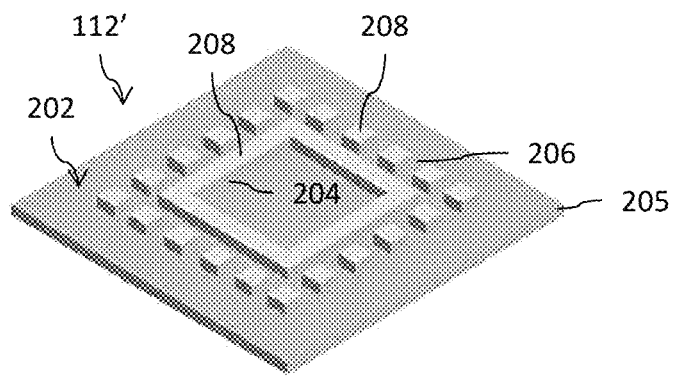
FIG. 3B is an isometric view of the bare tapeless leadframe package of FIG. 3A.
Figure 4A:
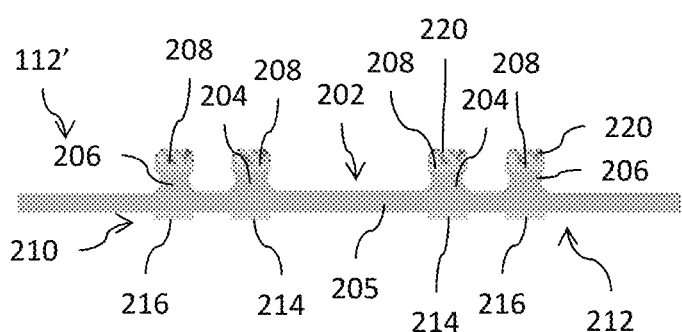
FIG. 4A is a cross-sectional view of the bare tapeless leadframe package with a conductive sintering material coating.
Figure 4B:
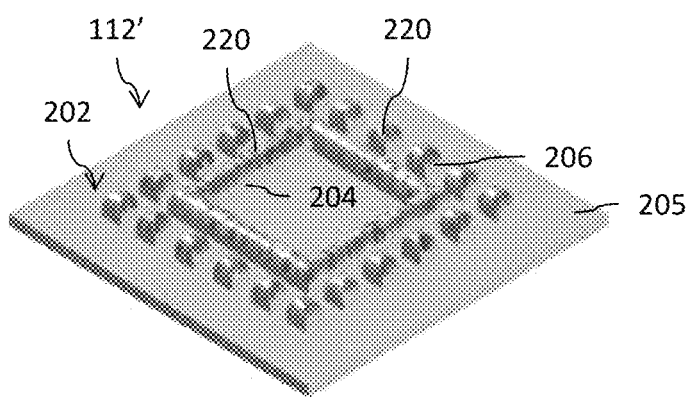
FIG. 4B is an isometric view of the bare tapeless leadframe package of FIG. 4A.

Reference is now made to FIG. 3A showing a cross-sectional view of a bare tapeless leadframe package 112' after being etched on a first side 202 to form a ring protrusion 204 and a plurality of lead protrusions 206 extending perpendicularly from a base layer 205. The plurality of lead protrusions 206 are arranged in a regular pattern surrounding the ring protrusion 204 (the regular pattern comprising, for example, an arrayed pattern, with the provision of a regular pitch between protrusions and/or the provision of arranged groups of protrusions). Thus, the ring protrusion 204 has a ring shape with an outer perimeter and an inner perimeter and the plurality of lead protrusions 206 are positioned outside the ring at distances offset from the outer perimeter. The top surfaces of the ring protrusion 204 and the plurality of lead protrusions 206 have a same height offset from the base layer 205. A first plating layer 208 is provided on the top surface of the ring protrusion 204 and the top surfaces of the plurality of lead protrusions 206, with this plating layer 208 having been patterned to define the size and shape of the ring protrusion 204 and plurality of lead protrusions 206 and further being used as a mask in connection with the selective etching of the first side 202. A second plating layer 210 is provided on a second side 212 of the bare tapeless leadframe package 112'. It will be noted that this second plating layer 210 is patterned identically to and positioned in alignment with the first plating layer 208 to include a ring portion 214 (aligned with and having the same size and shape as the portion of the plating layer 208 defining the ring protrusion 204) and a plurality of lead portions 216 (aligned with and having the same size and shape as the portions of the plating layer 208 defining the plurality of lead protrusions 206). FIG. 3B shows an isometric front (i.e., first) side view of the bare tapeless leadframe package of FIG. 3A.

A conductive sintering material 220 is deposited in contact with the plating layer 208 on top of the ring protrusion 204 and plurality of lead protrusions 206. The result of this process step is shown in the cross-sectional view of FIG. 4A and isometric view of FIG. 4B.

Next, an integrated circuit die 118 is mounted to the tapeless leadframe package 112'. The result of this process step is shown in the cross-sectional view of FIG. 5A and isometric view of FIG. 5B.

The integrated circuit die 118 includes a back side 222 and a front side 224. A semiconductor substrate 226 of the integrated circuit die 118 has a rear surface at the back side 210 of the integrated circuit die 118 and a front surface at which integrated circuits are provided, those integrated circuits including the environment (for example, optical) sensor 126. An interconnect layer 228 over the front surface of the substrate 226 includes wiring connections (not explicitly shown) for interconnecting the integrated circuits on the substrate 226 and further includes bonding pads 230 for supporting external electrical connections. A protection (passivation) layer 128, for example made of a glass material, is mounted to the interconnect layer 228. A front surface of layer 128 defines the front side 224 of the integrated circuit die 118. Openings are included in the protection layer 128 to expose the bonding pads 230.

The integrated circuit die 118 is mounted to the tapeless leadframe package 112' in a "flip chip" configuration with the front side 224 of the integrated circuit die 118 facing the first side 202 of the bare tapeless leadframe package 112'. In particular, the integrated circuit die 118 is arranged with the bonding pads 230 in alignment with the plurality of lead protrusions 206. The conductive sintering material 220 interposed between each bonding pad 230 and the plating layer 208 of the corresponding lead protrusion 206 forms, after curing, the bonding post 120 providing an electrical and mechanical interconnection between the integrated circuit die 118 and the tapeless leadframe package 112'. Additionally, the conductive sintering material 220 interposed between the front surface of layer 128 and the plating layer 208 of the ring protrusion 204 forms, after curing, a mounting attachment 234 providing a mechanical interconnection between the integrated circuit die 118 and the tapeless leadframe package 112' (it being possible, as well, for an electrical connection to be supported). This effectively seals an open region 238 delimited by the ring protrusion 204 and a portion of the base layer 205 that is aligned with the location of the environment (optical) sensor 126. The ring protrusion 204 supports mounting of the integrated circuit die 118 to the leadframe. It will be noted that the protective layer 128 will protect the integrated circuits of the die, and in particular the environment (optical) sensor, from the conductive sintering material 220 during attachment of the die to the tapeless leadframe package 112'.

Figure 5A:
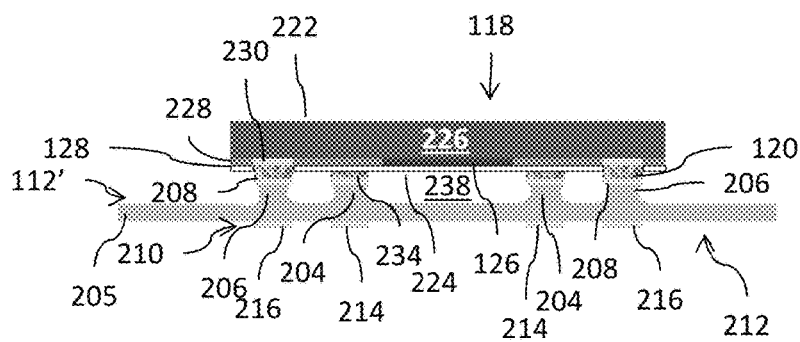
FIG. 5A is a cross-sectional view showing attachment of an integrated circuit die to the tapeless leadframe package.
Figure 5B:
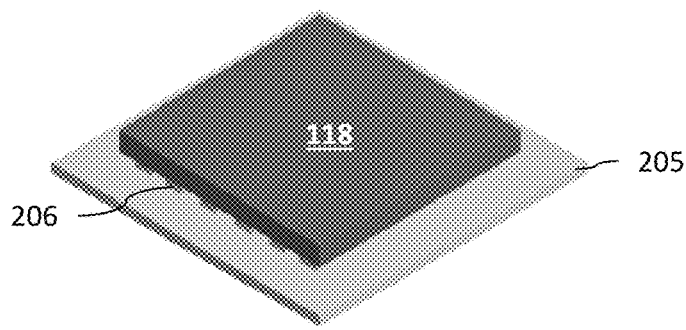
FIG. 5B is an isometric view of the structure shown in FIG. 5A.

Next, a transfer molding process is performed to embed the integrated circuit die 118 and the tapeless leadframe package 112' in an encapsulating body 122. The result of this process step is shown in the cross-sectional view of FIG. 6A and isometric front and back, respectively, views of FIGS. 6B and 6C. The structure shown in FIGS. 5A-5B is inserted within a mold cavity and an encapsulating material (such as an opaque epoxy) is injected into the mold cavity. The encapsulating material will surround the integrated circuit die 118 and fill any open spaces between the lead protrusions 206 and between the ring protrusion 204 and the lead protrusions 206. It will be noted that because the open region 238 is sealed, the encapsulating material does not flow into the open region and the environment (optical) sensor 126 is protected from being inadvertently covered by encapsulant. The encapsulated structure produced by the transfer molding process is then removed from the mold.

Next, an etch is performed on the second side 212 of the tapeless leadframe package 112'. This etch removes all of the base layer 205 with the exception of those portions of the base layer 205 which are protected by the ring portion 214 and plurality of lead portions 216 of the second plating layer 210 in order to form the die ring 114 and leads 116 of the leadframe 112. The etch is terminated when the undesired portions of the base layer 205 are removed and the encapsulating body 122 is reached. The etching of the base layer 205 unseals the open region 238 and exposes the environment (optical) sensor 126. The die ring 114 functions as a die support structure for the mounting of the integrated circuit die to the leadframe 112. It will be noted that the protective layer 128 will protect the integrated circuits of the die, and in particular the environment (optical) sensor, from the etchant used to etch away the undesired portions of the base layer 205. The result of this process step is shown in the cross-sectional view of FIG. 2A and isometric front and back, respectively, views of FIGS. 2B and 2C.

Figure 6A:
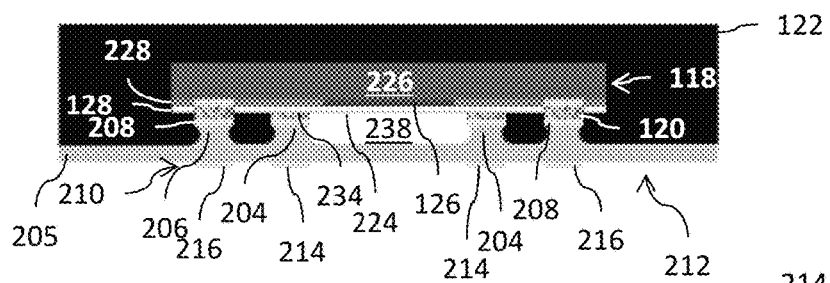
FIG. 6A is a cross-sectional view showing attachment of an encapsulation of the integrated circuit die and tapeless leadframe package.
Figure 6B:
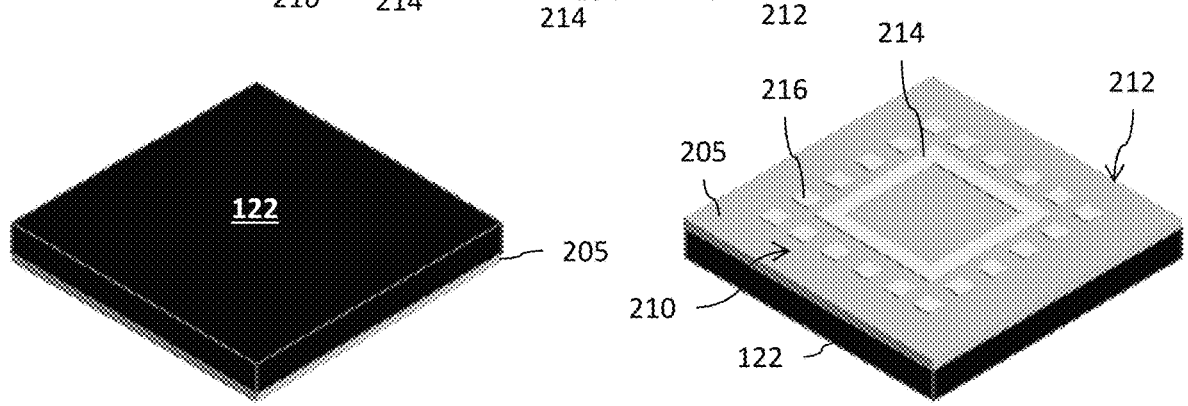
FIGS. 6B-6C are isometric views of the structure shown in FIG. 6A.
Figure 6C:
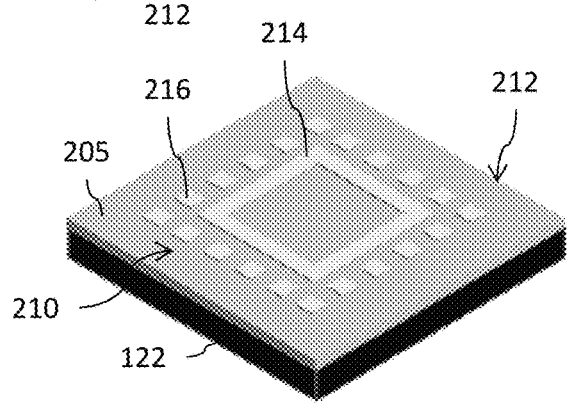

It will be understood that the manufacturing process is typically performed on a large scale basis. This is illustrated in FIGS. 7A-7E. FIG. 7A corresponds to the process step as shown in FIG. 3A except that a larger extent of the bare tapeless leadframe package 112' is shown (in this specific illustration, two sections 300a and 300b of the leadframe are shown). FIG. 7B corresponds to the process step as shown in FIG. 5A with an integrated circuit die 118 mounted in each section 300a, 300b of the tapeless leadframe package 112'. FIG. 7C corresponds to the process step as shown in FIG. 6A. It will be noted that the transfer molding operation is performed on the entire structure as shown in FIG. 7B. FIG. 7D corresponds to the step where an etch is performed on the second side 212 of the tapeless leadframe package 112'. This etch is performed on the entire structure as shown in FIG. 7C following removal from the mold. In order to form individual integrated circuit packages, a singulation operation is then performed by cutting along lines 302 through the encapsulating body 122. The result of the singulation operation, with the production of individual integrated circuit packages 304, is shown in FIG. 7E.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit package, comprising:
    a tapeless leadframe including a ring shaped die support and a plurality of leads arranged in a regular pattern surrounding the ring shaped die support;
    wherein the ring shaped die support surrounds an open region delimited by an inner perimeter of the ring shaped die support;
    an integrated circuit die mounted to the tapeless leadframe in flip-chip orientation with a front side of the integrated circuit die facing a first side of the tapeless leadframe;
    an electrical and mechanical attachment between a bonding pad of the integrated circuit die and a corresponding one of the plurality of leads;
    a mechanical attachment between the front side of the integrated circuit die and the ring shaped die support;
    wherein the integrated circuit die includes an environment sensor and wherein the open region of the ring shaped die support is aligned with the environment sensor; and
    an encapsulating block that encapsulates the integrated circuit die, the plurality of leads and the ring shaped die support without covering the open region.

2. The integrated circuit package of claim 1, further comprising:
    a first plating layer on top surfaces of the ring shaped die support and the plurality of leads;
    wherein the mechanical attachment is in contact with the first plating layer on the ring shaped die support; and
    wherein the electrical and mechanical attachment is in contact with the first plating layer on the plurality of leads.

3. The integrated circuit package of claim 2, further comprising a second plating layer on bottom surfaces of the ring shaped die support and the plurality of leads.

4. The integrated circuit package of claim 1, wherein the electrical and mechanical attachment is provided by a cured conductive sintering material.

5. The integrated circuit package of claim 1, wherein the mechanical attachment is provided by a cured conductive sintering material.

6. The integrated circuit package of claim 1, wherein the integrated circuit die includes a protection layer at the front side of an integrated circuit die, wherein the protection layer includes an opening at the bonding pad, and wherein the mechanical attachment is made between the protection layer and the ring shaped die support.

7. The integrated circuit package of claim 1, wherein the environment sensor is an optical sensor.

* * * * *